(12) United States Patent
Charlebois et al.

(10) Patent No.: US 8,754,696 B2
(45) Date of Patent: Jun. 17, 2014

(54) RING OSCILLATOR

(75) Inventors: Margaret R. Charlebois, Jericho, VT (US); Rashmi D. Chatty, Williston, VT (US); Christopher D. Hanudel, Essex Junction, VT (US); Robert D. Herzl, South Burlington, VT (US); David W. Milton, Underhill, VT (US); Clarence R. Ogilvie, Huntington, VT (US); Paul M. Schanely, Essex Junction, VT (US); Matthew P. Szafir, Williston, VT (US); Tad J. Wilder, South Hero, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/558,498

(22) Filed: Jul. 26, 2012

(65) Prior Publication Data

US 2014/0028365 A1    Jan. 30, 2014

(51) Int. Cl.
*H03H 11/26* (2006.01)

(52) U.S. Cl.
USPC .............. 327/276; 327/277; 327/99; 327/407

(58) Field of Classification Search
USPC ............................................ 327/276; 331/57
See application file for complete search history.

(56) References Cited

U.S. PATENT DOCUMENTS

| | | | |
|---|---|---|---|
| 5,903,521 A | 5/1999 | Relph | |
| 6,219,813 B1 | 4/2001 | Bishop et al. | |
| 6,272,439 B1 | 8/2001 | Buer et al. | |
| 6,515,549 B2 | 2/2003 | Nakano | |
| 6,934,671 B2 | 8/2005 | Bertsch et al. | |
| 6,963,250 B2 * | 11/2005 | Ngo et al. | 331/57 |
| 7,174,523 B2 | 2/2007 | Engel et al. | |
| 7,183,864 B1 | 2/2007 | Gutnik | |
| 7,210,051 B2 | 4/2007 | Patchen et al. | |
| 7,480,170 B1 | 1/2009 | Adams et al. | |
| 7,609,542 B2 | 10/2009 | Adams et al. | |
| 7,659,126 B1 | 2/2010 | Smith et al. | |
| 7,835,176 B2 | 11/2010 | Adams et al. | |
| 7,873,925 B2 | 1/2011 | Visweswariah et al. | |
| 8,020,138 B2 | 9/2011 | Balch et al. | |
| 8,049,526 B2 | 11/2011 | McManus et al. | |

(Continued)

OTHER PUBLICATIONS

Retdian et al., Voltage Controlled Ring Oscillator with Wide Tuning Range and Fast Voltage Swing, Proceedings of the 2002 IEEE Asia-Pacific Conference (ASIC, 2002), pp. 201-204.

(Continued)

*Primary Examiner* — Long Nguyen
*Assistant Examiner* — Patrick Chen
(74) *Attorney, Agent, or Firm* — David A. Cain; Hoffman Warnick LLC

(57) ABSTRACT

Aspects of the invention provide a circuit structure that automatically monitors a plurality of ring oscillators and dynamically selects the fastest or the slowest ring oscillator for feedback into the plurality of ring oscillators. In one embodiment, a circuit includes: a plurality of delay elements, each delay element associated with a ring oscillator; a first logic gate for receiving outputs of each of the delay elements; a second logic gate for receiving outputs of each of the delay elements; and a multiplexer for receiving an output of the first logic gate and an output of the second logic gate and choosing one of the outputs, wherein a selection for the multiplexer is based on an output of the multiplexer. To select the fastest ring oscillator, a second multiplexer is provided.

16 Claims, 4 Drawing Sheets

(56) References Cited

U.S. PATENT DOCUMENTS

| | | |
|---|---|---|
| 8,154,309 B2 | 4/2012 | Agarwal et al. |
| 8,214,699 B2 | 7/2012 | Arsovski et al. |
| 2006/0038622 A1 | 2/2006 | Choe et al. |
| 2008/0068100 A1 | 3/2008 | Goodnow et al. |
| 2008/0164910 A1* | 7/2008 | Kim et al. ........................ 326/46 |
| 2009/0091399 A1* | 4/2009 | Wong et al. ..................... 331/57 |
| 2009/0251223 A1 | 10/2009 | Nassif et al. |
| 2011/0109378 A1 | 5/2011 | Buechner et al. |

OTHER PUBLICATIONS

Boning et al., Test Structures for Delay Variability, Proceedings of the 8th ACM/IEEE International Workshop on Timing Issues in the Specification and Synthesis of Digital Systems (TAU '02), p. 109.

* cited by examiner

US 8,754,696 B2

RING OSCILLATOR

FIELD OF THE INVENTION

The disclosure relates generally to ring oscillators, and more particularly, to a circuit for monitoring ring oscillators and dynamically selecting a ring oscillator.

BACKGROUND

Ring oscillators are normally used to determine the speed at which a semiconductor chip is operating. The frequency at which the ring oscillator oscillates is a function of the chip speed. In the realm of ring oscillators, there are many applications such as adaptive voltage scaling (AVS) monitors/ clock generators, and voltage binning monitors, where the ring oscillators need to be monitored.

Depending on the circumstance, in some instances, it is required that the ring oscillators oscillate at the frequency that the fastest ring oscillator is oscillating at. On the other hand, in other instances, it is required that the ring oscillators oscillate at the frequency that the slowest ring oscillator is oscillating at. In the past, in order to determine which ring oscillator is the fastest, or which ring oscillator is the slowest, ring oscillators are monitored by reading the results of each oscillator and arithmetically calculating the minimum and maximum frequencies.

BRIEF SUMMARY

Aspects of the invention provide a circuit structure that automatically monitors a plurality of ring oscillators and dynamically selects the fastest or the slowest ring oscillator for feedback into the plurality of ring oscillators. In one embodiment, a circuit includes: a plurality of delay elements, each delay element associated with a ring oscillator; a first logic gate for receiving outputs of each of the delay elements; a second logic gate for receiving outputs of each of the delay elements; and a multiplexer for receiving an output of the first logic gate and an output of the second logic gate and choosing one of the outputs, wherein a selection for the multiplexer is based on an output of the multiplexer.

A first aspect of the disclosure provides a circuit, comprising: a plurality of delay elements, each delay element associated with a ring oscillator; a first logic gate for receiving outputs of each of the delay elements; a second logic gate for receiving outputs of each of the delay elements; and a multiplexer for receiving an output of the first logic gate and an output of the second logic gate and choosing one of the outputs, wherein a selection for the multiplexer is based on an output of the multiplexer.

A second aspect of the disclosure provides a circuit, comprising: at least two sets of delay elements, each delay element associated with a ring oscillator; first circuit for receiving a first set of delay elements, and outputting a fastest delay element within the first set of delay elements; a second circuit for receiving the second set of delay elements, and outputting a fastest delay element within the second set of delay elements; and a third circuit for receiving and comparing the fastest delay element within the first set of delay elements and the fastest delay element within the second set of delay elements, and outputting a slowest delay element.

A third aspect of the disclosure provides a circuit structure, comprising: a plurality of delay elements, each delay element associated with a ring oscillator; a first logic gate for receiving outputs of each of the delay elements; a second logic gate for receiving outputs of each of the delay elements; a first multiplexer for receiving an output of the first logic gate and an output of the second logic gate; and a second multiplexer for receiving an output of the first logic gate and an output of the second logic gate, wherein a selection for the first and second multiplexer is based on an output of the first multiplexer.

BRIEF DESCRIPTION OF THE DRAWINGS

The above and other aspects, features and advantages of the disclosure will be better understood by reading the following more particular description of the disclosure in conjunction with the accompanying drawings.

Figure 1:
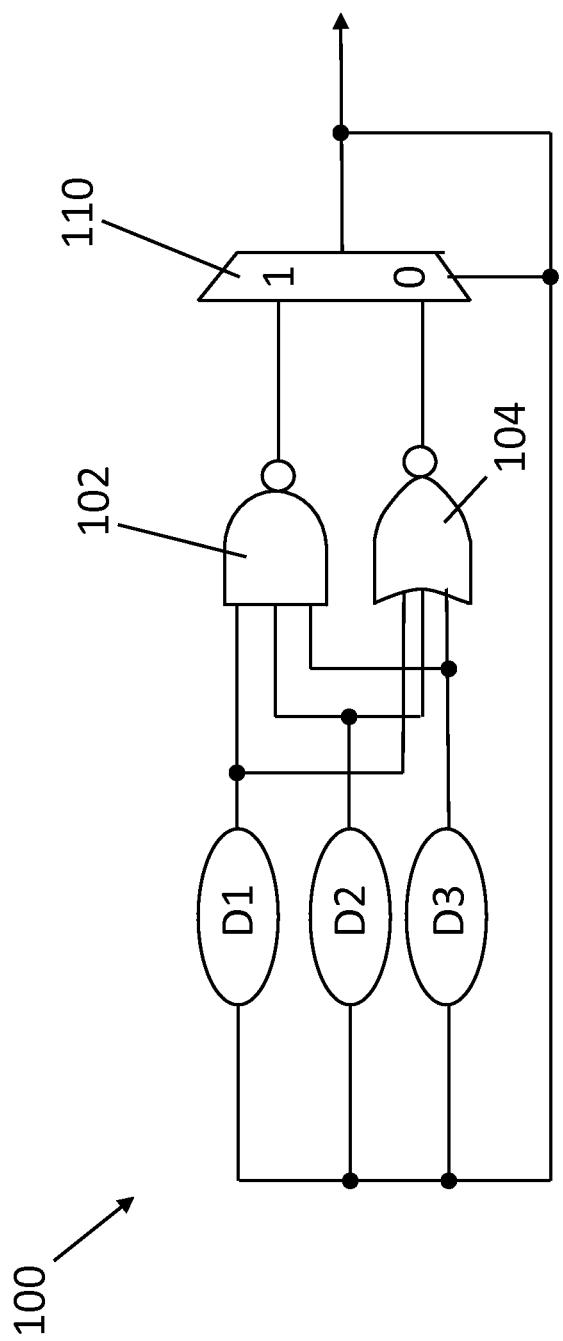
FIG. 1 shows a schematic view of a circuit according to embodiments of the invention.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

As mentioned above, the disclosure relates generally to ring oscillators, and more particularly, to a circuit for monitoring ring oscillators and dynamically selecting a ring oscillator.

Ring oscillators are normally used to determine the speed at which a semiconductor chip is operating. The frequency at which the ring oscillator oscillates is a function of the chip speed. In the realm of ring oscillators, there are many applications such as adaptive voltage scaling (AVS) monitors/ clock generators, and voltage binning monitors, where the ring oscillators need to be monitored.

Depending on the circumstance, in some instances, it is required that the ring oscillators oscillate at the frequency that the fastest ring oscillator is oscillating at. On the other hand, in other instances, it is required that the ring oscillators oscillate at the frequency that the slowest ring oscillator is oscillating at. In the past, in order to determine which ring oscillator is the fastest, or which ring oscillator is the slowest, ring oscillators are monitored by reading the results of each oscillator and arithmetically calculating the minimum and maximum frequencies.

Aspects of the invention provide a circuit structure that automatically monitors a plurality of ring oscillators and dynamically selects the fastest or the slowest ring oscillator for feedback into the plurality of ring oscillators. In one embodiment, a circuit includes: a plurality of delay elements, each delay element associated with a ring oscillator; a first logic gate for receiving outputs of each of the delay elements; a second logic gate for receiving outputs of each of the delay elements; and a multiplexer for receiving an output of the first logic gate and an output of the second logic gate and choosing one of the outputs, wherein a selection for the multiplexer is based on an output of the multiplexer. To select the slowest ring oscillator, the output of the multiplexer is fed back into the plurality of ring oscillators. To select the fastest ring oscillator, the output of the multiplexer is fed to a selection for a second multiplexer and the output of the second multiplexer is fed back into the plurality of ring oscillators.

Turning now to the figures, FIG. 1 shows a schematic view of a circuit 100 according to embodiments of the invention. Circuit 100 includes a plurality of delay elements D1, D2, D3 and each delay element D1, D2, D3 are associated with a ring oscillator. Although only three delay elements D1, D2, D3 are shown in circuit 100, it is understood that any number of ring oscillators may be present.

The output of each delay element D1, D2, D3 are sent to a first logic gate 102 and a second logic gate 104. Each of the logic gates 102, 104 receive the outputs of the plurality of delay elements D1, D2, D3. In the embodiment shown in FIG. 1, first logic gate 102 is a NAND gate, and second logic gate 104 is a NOR gate, with functionalities as known in the art. However, it is understood that these logic gates are for exemplary purposes only, and that other logic gates may be used, depending on the remaining circuit configuration of circuit 100, as will be described below.

The outputs of the first logic gate 102 and the second logic gate 104 are sent to a multiplexer 110. According to the functionality of the multiplexer 110, the output of the multiplexer 110 will be one of the inputs of the multiplexer 10. In this case, the inputs of the multiplexer 100 are the output of the first logic gate 102 or the output of the second logic gate 104. The selection for the multiplexer 110 is based on the output of the multiplexer. For example, in FIG. 1, if the output of the multiplexer 110 is a "1," the subsequent output of multiplexer 110 is the output of the first logic gate 102 (as shown connected to "1" of multiplexer 110). Correspondingly, in FIG. 1, if the output of multiplexer 110 is a "0," the subsequent output of multiplexer 110 is the output of second logic gate 104 (as shown connected to "0" of multiplexer 110). However, it is understood that the configuration of multiplexer 110, as shown in FIG. 1, is for exemplary purposes only, and that if the "1" and "0" inputs of multiplexer 110 are inverted, and other portions of the circuit 100 will be altered accordingly. It is also understood that multiplexer 110 includes the property that there is no activity on the output if the selection switches while both outputs of the first logic gate 102 and second logic gate 104 are at the same value (i.e., inputs to multiplexer 110 are the same).

This ring oscillator (shown as three delay elements D1, D2, D3). It is understood that each half (½) cycle of the ring oscillator's output clock (not shown) will have a pulse width equal to the longest of these three delay elements D1, D2, D3. As the delays change due to noise, temperature, and voltage, each pulse width (high or low) will be equal to the longest of the three delay elements D1, D2, D3. As shown in FIG. 1, this circuit 100 will oscillate using the slowest delay element D1, D2, D3. Multiplexer 110 will automatically monitor and dynamically select/choose the slowest delay element for feedback into delay elements D1, D2, D3.

Figure 2:
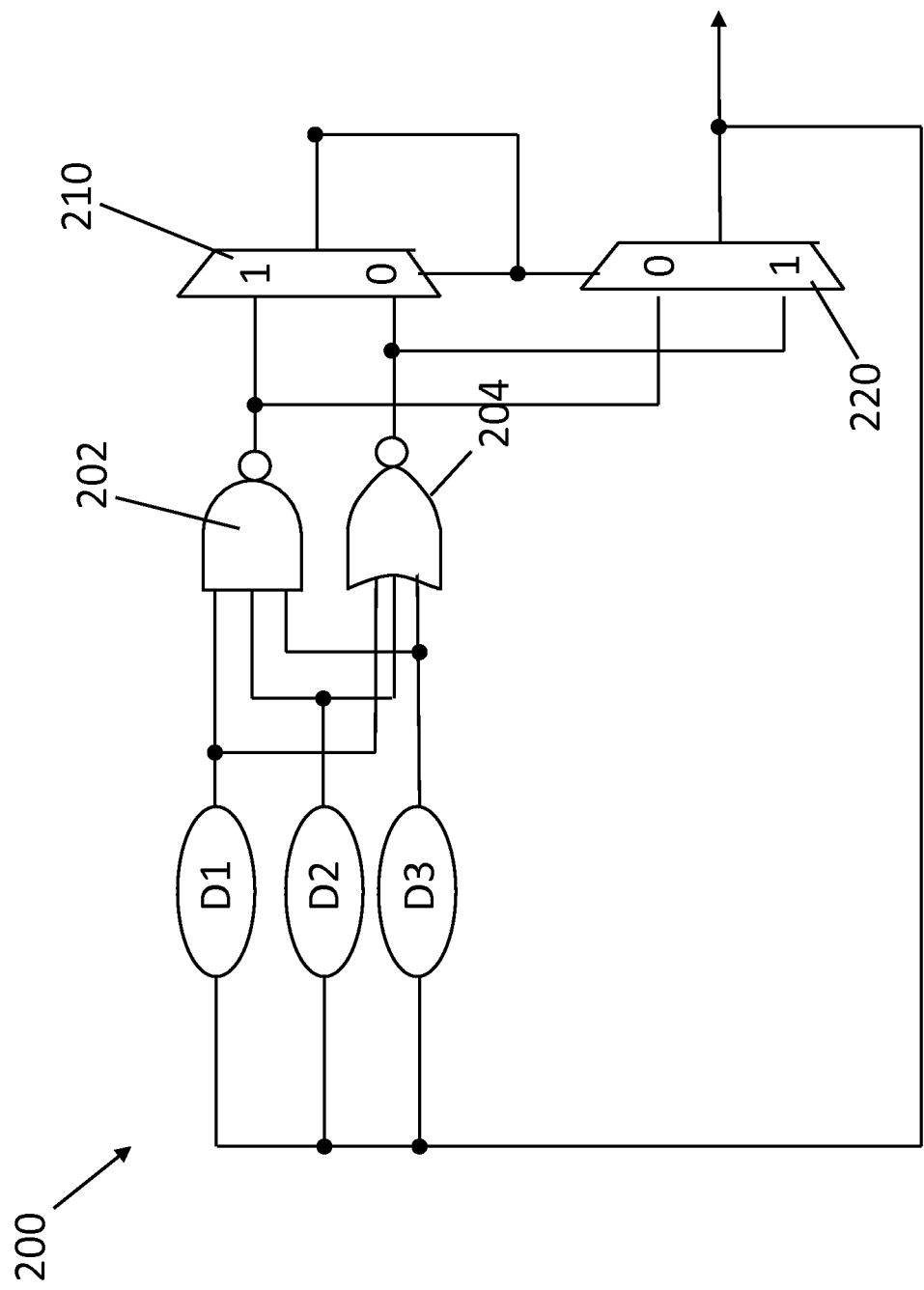
FIG. 2 shows a schematic view of a circuit according to embodiments of the invention.

Turning now to FIG. 2, a schematic view of a circuit 200 according to embodiments of the invention is shown. In this embodiment, an additional/second multiplexer 220 is included, and the output of second multiplexer 220 selects/chooses the fastest delay element for feedback into the delay elements D1, D2, D3. Second multiplexer 220 receives the same inputs as first multiplexer 210. That is, both first and second multiplexer 210, 220 receive the output of the first logic gate 202 and second logic gate 204, both of which receives inputs from delay elements D1, D2, D3. However, as seen in FIG. 2, the inputs of second multiplexer 220 are inversed from the inputs of the first multiplexer 210. That is, the output of the first logic gate 202 is fed to the "1" input of first multiplexer 210; however, the output of the first logic gate 202 is also fed to the "0" input of second multiplexer 220. Additionally, the output of second logic gate 204 is fed to the "0" input of first multiplexer 210 and the "1" input of second multiplexer 220. It is understood that the configuration shown in FIG. 2 is not meant to limit circuit 200 in any way, and other configurations are possible. For example, first and second multiplexers 210, 220 may include the same inputs. However, in this example, the outputs of first logic gate 202 and second logic gate 204 may be inverted, with an inverter, prior to second multiplexer 220.

This ring oscillator (shown as three delay elements D1, D2, D3). It is understood that each half (½) cycle of the ring oscillator's output clock (not shown) will have a pulse width equal to the shortest of these three delay elements D1, D2, D3. As the delays change due to noise, temperature, and voltage, each pulse width (high or low) will be equal to the shortest of the three delay elements D1, D2, D3. As shown in FIG. 2, this circuit 200 will oscillate using the fastest delay element D1, D2, D3. Multiplexer 210 will automatically monitor and dynamically select/choose the fastest delay element for feedback into delay elements D1, D2, D3.

Figure 3:
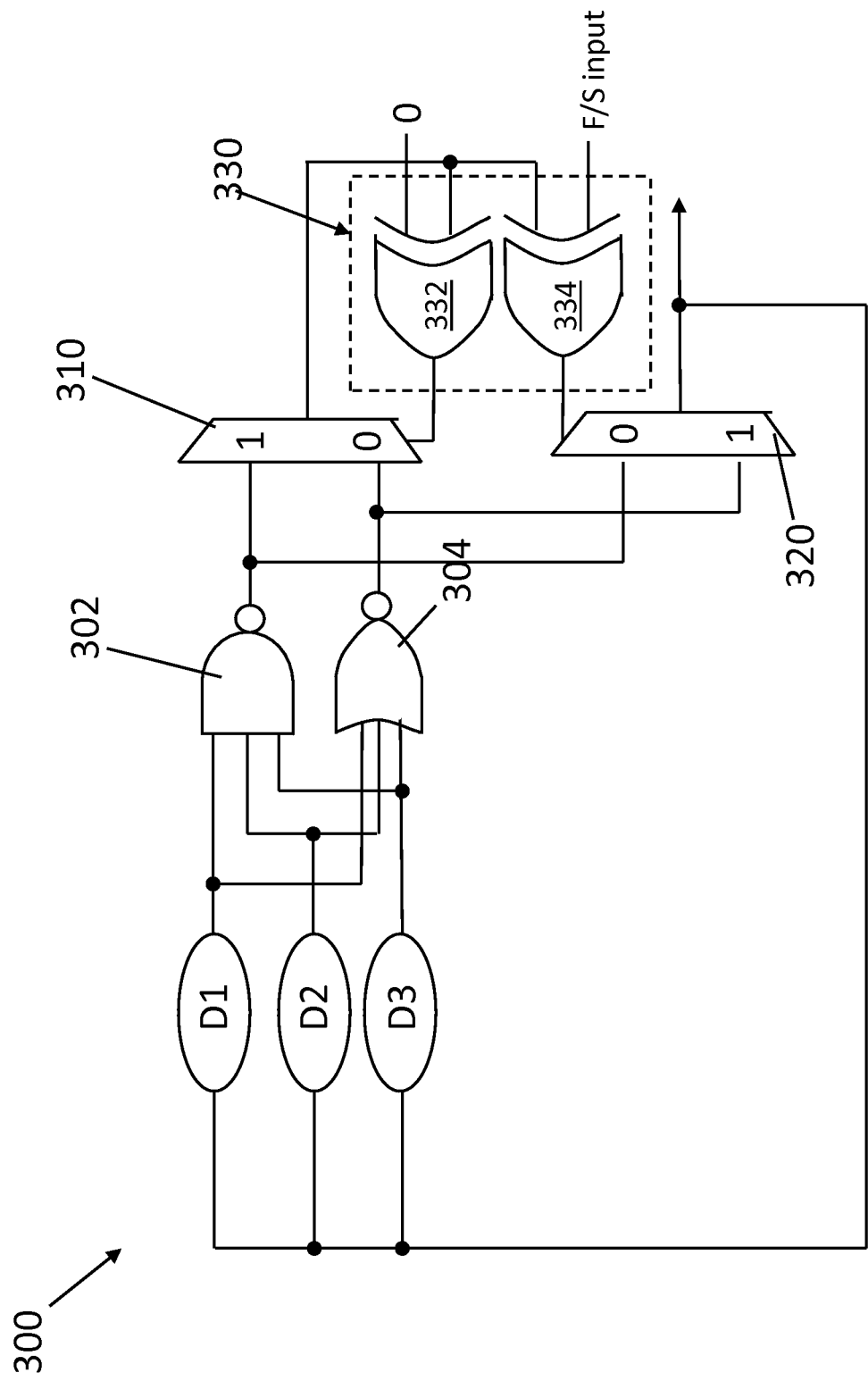
FIG. 3 shows a schematic view of a circuit according to embodiments of the invention.

Turning now to FIG. 3, a schematic view of a circuit 300 according to embodiments of the invention is shown. This circuit 300 includes a selection circuit 330 that enables second multiplexer 320 select/choose and output the fastest delay element or the slowest delay element.

Selection circuit 330 includes a plurality of logic gates 332, 334. As seen in FIG. 3, logic gates 332, 334 include XOR gates. The input to XOR gate 332 is a "0" and the output of first multiplexer 310. The input to XOR gate 334 is the output of first multiplexer 310 and an input labeled "F/S input" which selects whether the fastest delay element or the slowest delay element is selected and/or chosen by second multiplexer 320. In the embodiment shown in FIG. 3, a "1" for F/S input provides the fastest delay element, and a "0" for F/S input provides the slowest delay element. However, it is understood that this requirement may be inverted, based upon the circuit configuration provided.

Figure 4:
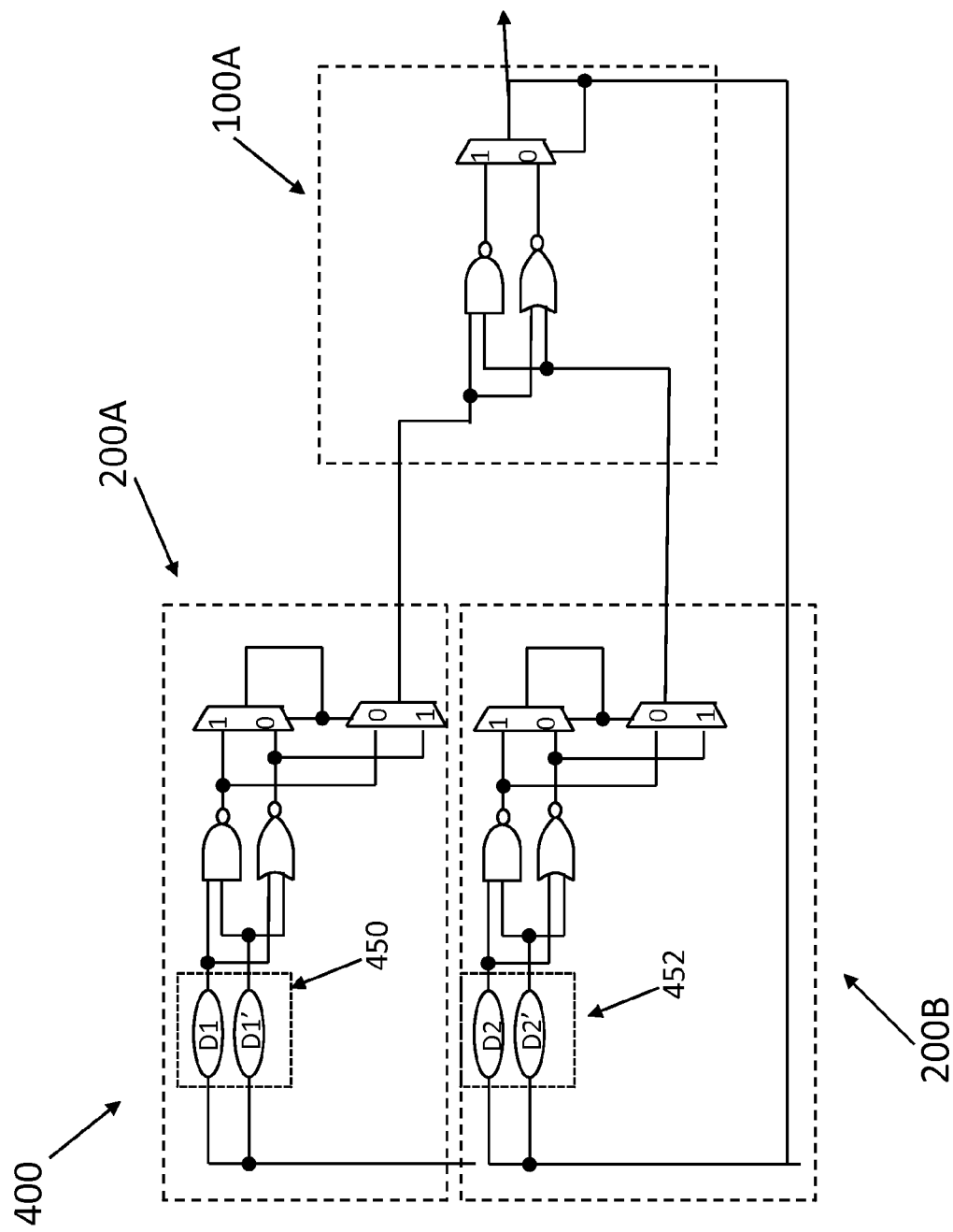
FIG. 4 shows a schematic view of a circuit according to embodiments of the invention.

Turning now to FIG. 4, a schematic view of a circuit 400 according to embodiments of the invention is shown. It is understood that other embodiments are possible, and that the embodiment shown in FIG. 4 is simply to illustrate that circuits (such as the circuits 100, 200, 300 shown in FIGS. 1-3) may be cascaded for different applications and/or purposes.

As shown, circuit 400 includes a first circuit 200A and a second circuit 200B (as in circuit 200 of FIG. 2), and a third circuit 100A (as in circuit 100 of FIG. 1). Circuit 400 includes at least two sets of delay elements 450, 452. A first set of delay elements 450 includes at least two delay elements D1, D1'. A second set of delay elements 452 includes at least two delay elements D2, D2'.

First circuit 200A, similar to the circuit 200 described in FIG. 2, selects/chooses the fastest delay element within first set of delay elements 450 (i.e., the fastest of D1 and D1'). Second circuit 200B, similar to circuit 200 described in FIG. 2, selects/chooses the fastest delay element within second set of delay elements 452 (i.e., the fastest of D2 and D2'). The outputs of both first circuit 200 and second circuit 200 are received by third circuit 100A and compared in order to output the slowest of delay element (of the fastest of D1, D1' and the fastest of D2, D2').

In this embodiment, first and second circuits 200A, 200B removes any AC defect that may be within the circuit 400. The third circuit 100A will then select the slowest of the non-AC defect delay elements.

It is understood that other configurations of cascading the embodiments shown in the figures is possible for other applications and/or purposes.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A circuit, comprising:
   a plurality of delay elements, each delay element associated with a ring oscillator;
   a first logic gate for directly receiving an output of each of the plurality of delay elements;
   a second logic gate for directly receiving the output of each of the plurality of delay elements; and
   a multiplexer for receiving an output of the first logic gate and an output of the second logic gate and for selecting the output of the first logic gate or the output of the second logic gate, wherein a selection for the multiplexer is based on an output of the multiplexer.

2. The circuit of claim 1, wherein the output of the multiplexer is sent to an input for each of the delay elements.

3. The circuit of claim 1, wherein the first logic gate is a NAND gate.

4. The circuit of claim 3, wherein the second logic gate is a NOR gate.

5. The circuit of claim 1, wherein the multiplexer chooses a slowest of the delay elements.

6. The circuit of claim 1, further comprising a second multiplexer for receiving the output of the first logic gate and the output of the second logic gate.

7. The circuit of claim 6, wherein inputs to the second multiplexer are an inverse to inputs to the first multiplexer.

8. The circuit of claim 7, wherein an output of the second multiplexer is sent as an input to each of the delay elements.

9. The circuit of claim 8, wherein the second multiplexer selects a fastest of the delay elements.

10. The circuit of claim 8, further comprising a selection circuit for enabling the second multiplexer to select one of: a slowest of the delay elements, or a fastest of the delay elements.

11. The circuit of claim 10, wherein the selection circuit includes a plurality of XOR gates, and an input to one of the XOR gates enables the second multiplexer to choose one of: the slowest of the delay elements, or the fastest of the delay elements.

12. A circuit structure, comprising:
    a plurality of delay elements, each delay element associated with a ring oscillator;
    a first logic gate for directly receiving an output of each of the plurality of delay elements;
    a second logic gate for directly receiving the output of each of the plurality of delay elements;
    a first multiplexer for receiving an output of the first logic gate and an output of the second logic gate and for selecting the output of the first logic gate or the output of the second logic gate; and
    a second multiplexer for receiving the output of the first logic gate and the output of the second logic gate and for selecting the output of the first logic gate or the output of the second logic gate, wherein a selection for the first and second multiplexer is based on an output of the first multiplexer.

13. The circuit structure of claim 12, wherein the output of the second multiplexer is sent to an input for each of the delay elements.

14. The circuit structure of claim 12, wherein the first logic gate is a NAND gate.

15. The circuit structure of claim 14, wherein the second logic gate is a NOR gate.

16. The circuit structure of claim 12, wherein the second multiplexer selects a fastest of the delay elements.

* * * * *